Figure 1:
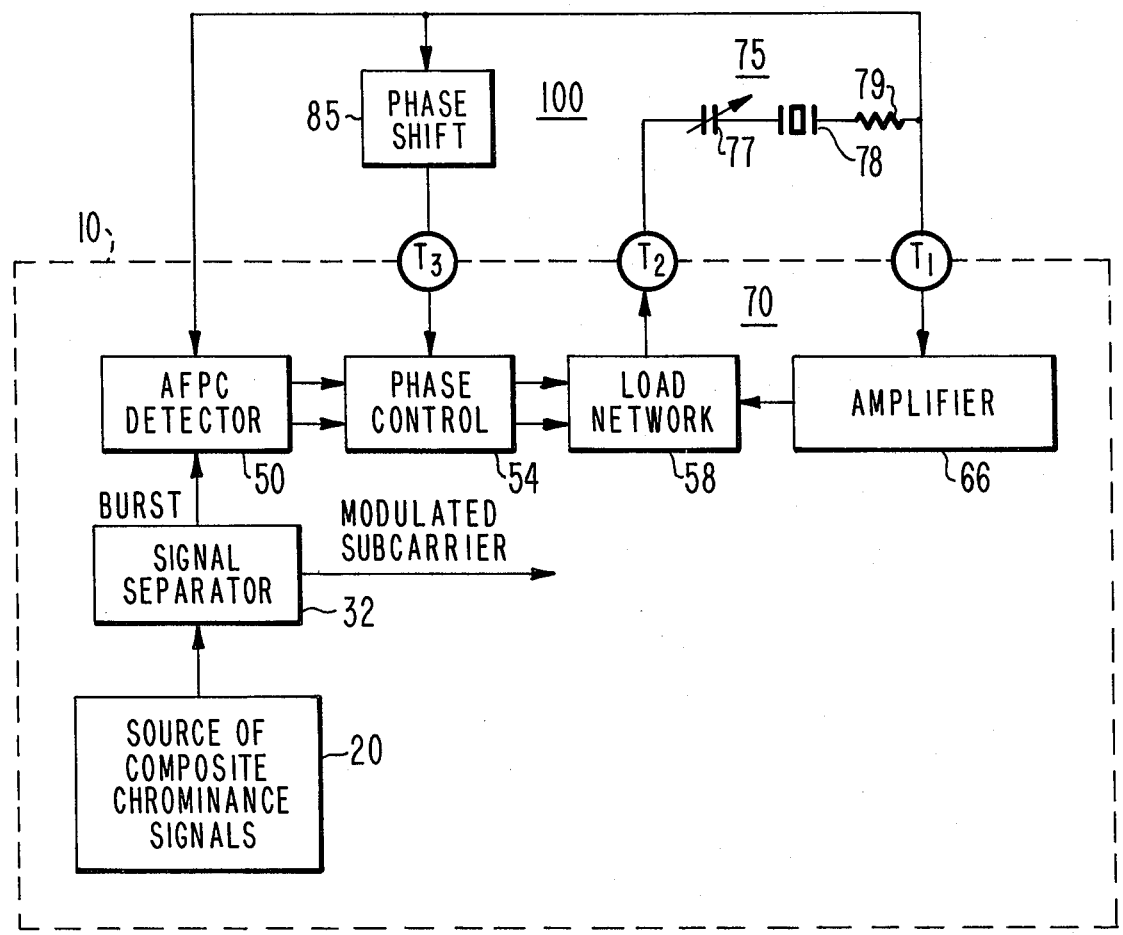

United States Patent [19]

Groeneweg et al.

[11] 4,095,255
[45] June 13, 1978

[54] CONTROLLED OSCILLATOR WITH INCREASED IMMUNITY TO PARASITIC CAPACITANCE

[75] Inventors: Willem Hendrik Groeneweg, Ottenbach; Alois Vaclav Tuma, Schlieren, both of Switzerland; Leopold Albert Harwood, Bridgewater, N.J.

[73] Assignee: RCA Corporation, New York, N.Y.

[21] Appl. No.: 785,591

[22] Filed: Apr. 7, 1977

[51] Int. Cl.² .......................... H04N 9/44; H03B 3/04; H03B 5/00
[52] U.S. Cl. .......................................... 358/17; 331/8; 358/25
[58] Field of Search .......................... 358/17, 19, 25; 331/1 R, 8, 17, 18, 25

[56] References Cited

U.S. PATENT DOCUMENTS 3,763,439  10/1973  Peil .......................................... 331/8

Primary Examiner—Robert L. Richardson
Attorney, Agent, or Firm—Eugene M. Whitacre; William H. Meagher; Ronald H. Kurdyla

[57] ABSTRACT

A controlled oscillator comprises an amplifier including an active device, a filter network arranged in a feedback loop of the amplifier for providing regenerative feedback to sustain oscillation of the amplifier, and a source of control signals. A common load network is provided for oscillatory signals produced by the amplifier and for the control signals, and is coupled to the filter network. The common load network comprises amplifying means having a low input impedance relative to an impedance presented to the oscillatory and control signals by parasitic capacitances which may be associated with respective output terminals of the active device and the source of control signals.

11 Claims, 2 Drawing Figures

CONTROLLED OSCILLATOR WITH INCREASED IMMUNITY TO PARASITIC CAPACITANCE

This invention relates to oscillator circuits, and more particularly to controlled oscillators with reduced phase shift attributable to parasitic capacitance.

In many types of apparatus, there is a requirement for an oscillator having predictable phase and frequency operating characteristics including a symmetrical range of phase and frequency control. These characteristics are especially desirable for a controlled oscillator employed in a chrominance channel of a color television receiver in order to provide a reference signal for demodulating chrominance signal information, for example. Such an oscillator typically is controlled in response to a voltage proportional to a phase or frequency difference between a locally generated oscillator reference signal and a burst signal component of the chrominance signal. One example of such a controlled oscillator is described in a copending U.S. patent application of Leopold A. Harwood, Ser. No. 633,462, and now U.S. Pat. No. 4,020,500 and entitled "Controlled Oscillator", filed Nov. 19, 1975 and assigned to the same assignee as the present invention.

An oscillator commonly employs a resonant circuit (e.g., including a crystal filter) in a feedback loop of the oscillator for determining a desired frequency of operation. Tuning of the resonant circuit to establish a precise operating frequency often is accomplished in an economical manner by means of a small, variable tuning capacitance associated with the resonant circuit. Parasitic capacitance associated with the oscillator can impair the operation of the oscillator by introducing unwanted signal phase shift. Such phase shift can upset the tuning of the resonant circuit and the pull-in range of the oscillator, and limit the range of tuning which can be provided by the variable tuning capacitance. In a voltage controlled oscillator, an unsymmetrical range of control also can result.

The parasitic capacitance can be associated with circuits coupled to the resonant circuit. For example, in an oscillator including a resonant circuit arranged in feedback relation with an amplifier, the parasitic capacitance can be associated with an output of the amplifier coupled to the resonant circuit. In the case of a controlled oscillator, such capacitance also can be associated with a control circuit also coupled to the resonant circuit.

It is therefore desirable to reduce the adverse effects of such parasitic capacitance upon the operation of an oscillator.

Accordingly, apparatus in accordance with the present invention comprises a controlled oscillator including an amplifier having an active device, and a source of control signals. A filter network is arranged in a feedback loop of the amplifier for providing regenerative feedback of sufficient magnitude to produce an oscillatory signal at an output terminal of the active device. A common load network is provided for the oscillatory and control signals, and is coupled to the filter network. The common load network comprises amplifying means having a low input impedance relative to an impedance presented to the oscillatory and control signals by parasitic capacitances which may be associated with respective output terminals of the active device and the source of control signals.

Figure 2:
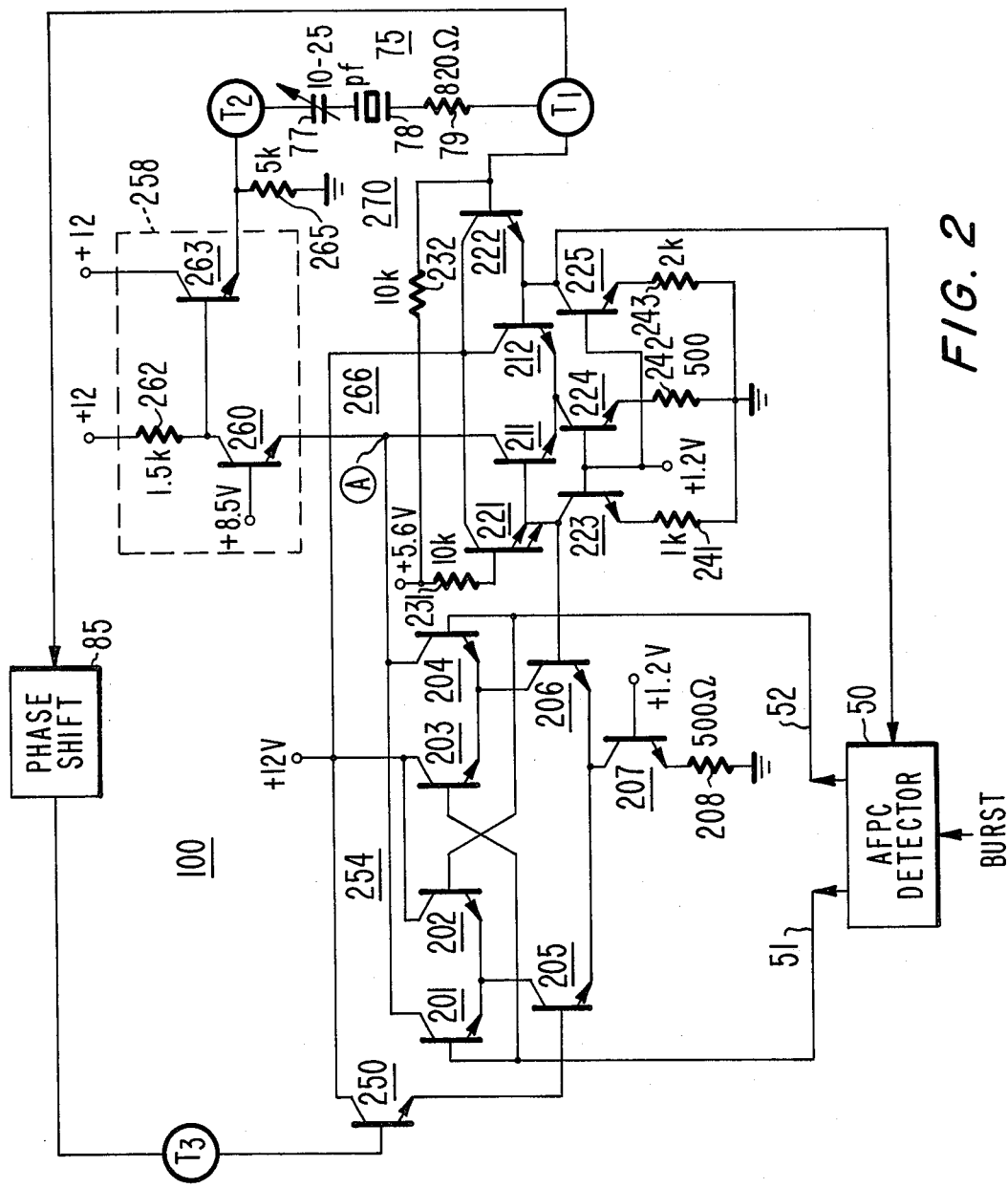

In the drawing:

FIG. 1 is a diagram in block form of a portion of a chrominance signal processing channel of a color television receiver to which the principles of the present invention may be applied; and FIG. 2 is a diagram partially in block form and partially in schematic circuit diagram form of a portion of the chrominance channel shown in FIG. 1 including an embodiment of the present invention.

Referring to FIG. 1, it is first noted that the blocks within a dashed outline 10 represent signal processing functions which are capable of being included on a single, monolithic integrated circuit. In such case, terminals $T_1$, $T_2$ $T_3$ represent external connections to the integrated circuit. A source of composite chrominance signal 20 supplies color-representative signals comprising, for example, color difference signal information (R-Y, B-Y and G-Y) imposed as amplitude modulation at selected phases of a suppressed color subcarrier wave, and a color burst component of the composite signal. Under the broadcast standards employed by the United States, which are typical standards for purposes of the present discussion, color burst information is transmitted during a relatively short synchronizing interval following the end of each image-representative portion of the signal corresponding to a horizontal scanning line. The color burst typically consists of several cycles of an unmodulated waveform having a frequency equal to that of a reference color subcarrier signal.

The burst and modulated subcarrier components of the composite chrominance signal are separated by a signal separator 32 (e.g., a keyed amplifier). The separated modulated subcarrier component is coupled to succeeding chrominance processing circuits (e.g., including tint control, automatic color control, matrix and demodulator circuits) for ultimately deriving color-representative R, B and G signals in known fashion. The R, B and G signals are applied in a known manner to an image reproducing kinescope of the receiver (not shown).

Separated burst signals from signal separator 32 are supplied to an automatic frequency and phase control (AFPC) detector 50. The AFPC detector 50 is also supplied with an oscillatory reference signal from a voltage controlled color oscillator 100 including a phase control stage 54, an oscillator 70 and a phase shift network 85. Oscillator 70 comprises an amplifier 66 and a feedback path including load network 58 and a resonant circuit 75. Controlled oscillator 100 is described in detail in the aforementioned allowed U.S. patent application. The AFPC detector 50 may, for example, be of the type described in U.S. Pat. No. 3,740,456, granted to Leopold A. Harwood and assigned to RCA Corporation. AFPC detector 50 provides output control signals representative of the phase and/or frequency relationship between the transmitted burst component and a reference signal produced by controlled oscillator 100. Filtered output signals from AFPC detector 50 are applied to phase control stage 54 of controlled oscillator 100, the operation of which will be discussed in connection with FIG. 2.

Referring now to FIG. 2, controlled oscillator 100 is shown as including a closed loop oscillator circuit 270 and a separate control stage 254.

Oscillator 270 is arranged to produce a continuous wave signal at the nominal chrominance sub-carrier frequency (e.g., about 3.58 MHz according to television standards in the United States). Oscillator 270 comprises an amplifier 266 formed by emitter coupled transistors 211 and 212 which are arranged to amplify and limit signals in the oscillator loop, and a frequency determining resonant circuit 75 including a narrow band crystal filter 78, and adjustable tuning capacitor 77 and a resistor 79 arranged in series between terminals $T_2$ and $T_1$. Crystal 78 has a resonant frequency about the chrominance subcarrier frequency, the resonant frequency being more precisely determined by adjusting variable capacitor 77. Resistor 79 is dimensioned to provide a bandwidth for resonant circuit 75 of the order of 1000 Hz, centered about the nominal 3.58 MHz oscillator frequency at the −3 db point. The 1000 Hz bandwidth contributes to a pull-in range of about ±500 Hz for oscillator 270. Output signals from amplifier 266 appear at a collector of transistor 211 at a circuit point A, and are coupled to terminal $T_2$ via a common base amplifier transistor 260, a load resistor 262 and an emitter follower buffer transistor 263. A terminating resistor 265 couples an emitter of transistor 263 to ground.

A current source transistor 224 is coupled from interconnected emitters of transistors 211 and 212 to a point of reference potential (ground) via a bias resistor 242. Operating bias for amplifier transistors 211, 212 is provided by a dual-emitter bias transistor 221, transistors 222–225, and resistors 241–243 arranged as shown.

Signals appearing at terminal $T_1$, hereinafter called "in-phase" signals, are phase shifted by phase shift network 85 (e.g., an inductance-capacitance network). In this example, output signals from network 85 exhibit a lagging phase shift of about ninety degrees at resonance (e.g., 3.58 MHz) compared to the in-phase signals. The signals from network 85, hereinafter referred to as "quadrature" signals, are coupled to control stage 254 of controlled oscillator 100 via terminal $T_3$ and an emitter follower buffer transistor 250. The quadrature signals also can be coupled to tint control and automatic color control (ACC) circuits included in additional chrominance signal processing circuits (not shown), and the in-pahse signals also can be coupled to the tint control circuit, as described in the aforementioned copending U.S. patent application.

Control stage 254 comprises a balanced amplifier with first and second similar pairs of differentially connected transistors 201, 202 and 203, 204 arranged as shown and responsive to control signals supplied from AFPC detector 50, and a third pair of differentially connected transistors 205, 206, also arranged as shown and supplied with quadrature signals via transistor 250. Base input electrodes of transistors 201 and 203 are connected in common to a control signal output of AFPC detector 50 via a line 51, and the base input electrodes of transistors 202 and 204 are connected in common to a bias output of AFPC detector 50 via a line 52. A transistor 207 and a resistor 208 provide operating currents for stage 254.

It is noted that a voltage appearing on output line 51 includes a voltage representing deviations of the burst and oscillator reference signals from a desired (quadrature) phase relationship, together with a quiescent voltage component associated with output circuitry of AFPC detector 50. A voltage appearing on output line 52 is representative of the quiescent component. Therefore, a differential control voltage appearing between lines 51 and 52 represents a control signal which is indicative of deviations of the desired phase relationship and which is substantially insensitive to variations of the D.C. component, as explained in U.S. Pat. No. 3,740,456.

In a normal operating mode for proper demodulation of the received chrominance signal, it is desired that the nominally in-phase signals at terminal $T_1$ have a frequency equal to that of the received burst component and be in quadrature phase (ninety degrees) relationship therewith. The desired signal relationship is provided by control stage 254 in cooperation with oscillator 270 as described in the copending U.S. patent application mentioned previously.

Briefly, the in-phase oscillatory signals of oscillator 270 appear at the collector of transistor 211 and circuit point A. This signal is coupled via transistor 260, resistor 262, transistor 263, resonant circuit 75, follower transistor 222 and transistor 212 to complete the feedback loop of oscillator 270.

Control stage 254 produces equal by oppositely phased quadrature output signals at respective collectors of transistors 201 and 204. AFPC detector 50 is supplied with burst signals and with in-phase signals from oscillator 270 via an emitter of follower transistor 222, to produce control signals representative of the phase and/or frequency difference between the in-phase and burst signals. The quadrature output signals of stage 254 are controlled in magnitude by varying the conduction of transistors 201–204 as a function of the magnitude of the control signals from AFPC detector 50.

When the in-phase oscillator reference signals and the burst signals are in proper phase and frequency relationship (i.e., same frequency and 90° phase relationship), AFPC detector 50 produces control signals on each output line which are of equal magnitude. Transistors 201 and 204 therefore each conduct signal currents of equal magnitude but opposite phase, corresponding to the quadrature signal supplied from transistors 205 and 206, which cancel when combined at point A. When the oscillator and burst signals deviate from the desired relationship, AFPC detector 50 develops output control signals which are unequal in magnitude. Transistors 201 and 204 then conduct unequal amounts of quadrature signal currents to produce a resultant quadrature signal component at point A with a magnitude and phase determined by the relative magnitude and phase of control signals provided by AFPC detector 50. In this manner, versions of the quadrature signal are developed at point A of a magnitude and phase in accordance with the magnitude and phase of control signals applied to the base electrodes of transistors 201, 202 and 203, 204 from AFPC detector 50.

A signal thus appearing at point A is a resultant of quadrature signals from the collectors of transistors 201, 204 of phase control stage 254, combined with in-phase signals from the collector of transistor 211 of oscillator stage 270. This resultant signal exhibits a phase between the phases of the in-phase and quadrature signals. The resultant signal appears across load resistor 262 via the collector-emitter path of transistor 260, and is coupled by transistor 263 to resonant circuit 75 to adjust the operating frequency and phase of oscillator 270. The adjustment of the operating frequency is a function of the bandwidth of resonant circuit 75 and the amount of phase shift introduced into the oscillator feedback loop as determined by the resultant signal. In this example, the resultant signal can exhibit a phase within a range of about 90° (i.e., ±45°) as determined by the magnitude and polarity of the quadrature signal from control stage 254.

The operating frequency of oscillator 270 remains unchanged in the absence of quadrature signals supplied from control stage 254, when the signal frequency of oscillator 270 and the burst signal frequency are substantially equal. The signal developed across resistor 262 and supplied to resonant circuit 75 therefore corresponds to the oscillator reference signal at the nominal zero degrees reference phase. Positive or negative deviations from the desired frequency relationship result in corresponding positive or negative amounts of quadrature signal being supplied from control stage 254, to form the resultant signal with a phase angle representative of the frequency deviation when the quadrature and in-phase signals are combined at point A. The operating frequency of oscillator 270 is altered to correspond to the frequency of the burst signal, and the net phase shift around the feedback loop of oscillator 270 remains zero for sustaining oscillation.

Additional details of the structure and operation of controlled oscillator 100 are found in the copending U.S. patent application mentioned previously.

It is noted that each of the output collector electrodes of transistors 201 and 204 of control stage 254 has associated therewith a parasitic capacitance (i.e., collector-base and collector-substrate capacitance) of approximately two picofarads. A similar parasitic capacitance also appears at the collector output of transistor 211 of oscillator 270. Thus a total parasitic capacitance appearing at point A represents the sum of the capacitances associated with the collectors of transistors 201, 204 and 211.

The total parasitic capacitance presents an impedance to the signals developed at point A such that the total capacitance can contribute to the production of an undesired signal phase shift. For example, for a given magnitude and polarity of quadrature signals from stage 254, such phase shift can cause the phase of the resultant signal at point A to be offset from an expected phase. Unsymmetrical control of oscillator stage 270 therefore results.

More specifically, in this example crystal 78 is arranged in network 75 to operate between series and parallel resonant modes. Crystal 78 ideally will resonate at a design frequency intermediate between lower and upper frequencies respectively associated with the series and parallel resonant modes. Tuning capacitor 77 is adjusted to establish the design operating frequency about which crystal 78 exhibits a desired frequency pull-in range. Thus the parallel and series mode frequencies define an operating frequency range within a portion of which crystal 78 can be tuned by capacitor 77, and within a portion of which variations of oscillation signal phase produce corresponding variations of oscillation signal frequency, as is known. The pull-in range of crystal 78 encompasses a predetermined segment of the aforementioned operation range, and the pull-in capability of crystal 78 diminishes as parallel resonant operation (±90° deviation from a nominal zero degrees reference phase) or series resonant operation (−90° deviation from the nominal zero degrees reference phase) is approached.

The undesired phase shift introduced by the parasitic capacitances serves to shift the "phase axis" about which phases of the resultant signal are developed (e.g., ±45° about a nominal zero degree phase axis). For example, the undesired phase shift can cause the phase axis to shift toward the phase (e.g., +90°) associated with the parallel resonant mode. One extreme of the phase range of the resultant signal will then approach more closely (or exceed) the phase associated with the parallel resonant mode. A resultant signal with a phase at or near such extreme may be beyond the pull-in capability of the crystal. That is, the phase of the resultant signal may not have the desired effect of producing a corresponding change in the operating frequency of oscillator 270, in accordance with the phase-versus-frequency response of crystal 78. An unsymmetrical pull-in range with attendant unsymmetrical control of oscillator 270 therefore results.

The undesired signal phase shift can be substantially reduced by a network 258, representing a common load network for the in-phase and quadrature signals appearing at point A. Network 258 essentially represents a signal amplification network having low input and output impedance.

Common base amplifier transistor 260 presents a low, substantially resistive, emitter input impedance (e.g., of the order of 40-60 ohms) relative to the impedance presented by the total parasitic capacitance to the in-phase and quadrature signals appearing at point A. The low input impedance of transistor 260 serves to significantly reduce the amount of unwanted signal phase shift which would otherwise be produced, for example, if load resistor 262 were directly connected to point A. In this example, a threefold reduction of (collector-base) parasitic capacitance and attendant signal phase shift is produced.

The operation of controlled oscillator 100 is optimized by reducing the signal phase shift caused by the parasitic capacitance. Tuning of oscillator stage 270 at a desired center operating frequency is facilitated, and a desired pull-in range about the operating frequency results. A more symmetrical range of phase and frequency control also results.

The use of a low input impedance common base arrangement as discussed is particularly attractive in the context of the illustrated controlled oscillator. Common base device 260 exhibits an excellent signal bandwidth response in the frequency range of color subcarrier frequency signals (i.e., 2-4 MHz). Common base transistor 260 also isolates the collectors of transistors 201, 204 and 211 from load voltage variations, thereby minimizing Miller effect multiplication of collector-base capacitances of transistors 201, 204 and 211.

It is noted that in the absence of transistor 260 (i.e., if load resistor 262 were directly connected to point A), additional circuits could be employed to develop an additional phase shift to counteract the undesired phase shift attributable to the parasitic capacitances. For example, a high-pass resistance-capacitance phase shift network could be interposed between the emitter of transistor 263 and resonant circuit 75 in the circuit of FIG. 2 for this purpose. However, the use of such an additional phase shift network is considered to be an uneconomical solution, especially when control stage 254, oscillator stage 270, network 258 and AFPC detector 50 are intended to be formed on a single, monolithic integrated circuit. In such case, the resistance-capacitance elements of the additional phase shift network would undesirably occupy valuable surface area of the integrated circuit chip.

It is also noted that other circuit arrangements can be employed to provide a suitably low impedance at point A relative to the impedance presented by the total parasitic capacitance to the in-phase and quadrature signals at point A.

One example of a circuit arrangement capable of providing a suitably low input impedance of the order of that provided by a common base stage comprises a PNP transistor having a PN device coupled across a base-emitter junction of the PNP transistor. The PN device may, for example, comprise a diode formed by a diode connected transistor (i.e., with interconnected base and collector electrodes) and poled for current conduction in the same direction as the base-emitter junction of the PNP transistor. Such a combination of a PN device and a transistor forms a so-called "current mirror" circuit, wherein current flowing in the PN device is replicated, or "mirrored," in the collector of the transistor. In this circuit arrangement, input signals are applied to a base electrode of the PNP transistor and output signals appear across a load resistor included in the collector circuit of the PNP transistor. In this example, the PN device can be replaced by a low value resistor (e.g., 50 ohms).

What is claimed is:

1. A controlled oscillator comprising:
   an amplifier including an active device having an output terminal, said output terminal having a parasitic capacitance associated therewith;
   a filter network arranged in a feedback loop of said amplifier for providing regenerative feedback of sufficient magnitude to produce an oscillatory signal at said output terminal of said active device;
   a source of control signals providing control signals at an output terminal, said output terminal having a parasitic capacitance associated therewith; and
   a common load network for said oscillatory and control signals coupled to said filter network, said common load network comprising amplifying means having a low input impedance relative to an impedance presented by said parasitic capacitances to said oscillatory and control signals.

2. An oscillator according to claim 1, wherein:
   said input impedance is substantially resistive.

3. An oscillator according to claim 2, wherein said amplifying means comprises:
   a transistor arranged in common base amplifier configuration, said transistor having an input emitter electrode coupled to said oscillatory and control signals for providing said low input impedance, and an output collector electrode providing a combined signal comprising said oscillatory and control signals.

4. An oscillator according to claim 3 and further comprising:
   a load impedance coupled to said output collector electrode of said common base transistor.

5. An oscillator according to claim 4, wherein:
   said input impedance is of a magnitude substantially less than that of said load impedance.

6. An oscillator according to claim 4 and further comprising:
   a common collector transistor having a base electrode coupled to said load impedance and an emitter electrode coupled to said filter network for supplying said combined signal to said filter network at a low impedance.

7. A controlled oscillator comprising:
   an amplifier including a first active device having a first output terminal, said first output terminal having a parasitic capacitance associated therewith;
   a source of control signals including a second active device having a second output terminal, said second output terminal having a parasitic capacitance associated therewith;
   a common load network coupled to said first and second output terminals, said common load network comprising amplifying means having a low input impedance relative to an impedance presented by said parasitic capacitances at signal frequencies; and
   a filter network coupled to said common load network and arranged in a feedback loop of said amplifier for providing regenerative feedback of sufficient magnitude to produce an oscillatory signal at said first output terminal of said first active device.

8. An oscillator according to claim 7, wherein:
   said first active device comprises a first transistor and said first output terminal is a collector electrode of said first transistor; and
   said second active device comprises a second transistor and said second output terminal is a collector electrode of said second transistor.

9. An oscillator according to claim 8, wherein said common load network comprises:
   a third transistor arranged in common base amplifier configuration, said third transistor having an input emitter electrode coupled to said collector electrodes of said first and second transistors, and an output collector electrode;
   a load impedance coupled to said collector electrode of said third transistor; and
   means for coupling said load impedance to said filter network.

10. An oscillator according to claim 7, wherein:
    said oscillator includes means for providing an alternating current signal exhibiting a phase different from a phase of said oscillatory signal;
    said source of control signals comprises:
      first and second transistors responsive to said alternating current signal, each having a base electrode, an emitter electrode, and a collector output electrode, with an associated parasitic capacitance, and
      means for controlling the conduction of said first and second transistors in complementary fashion;
    said first active device of said amplifier comprises a third transistor having a collector output electrode with an associated parasitic capacitance; and
    said collector output electrodes of said first, second and third transistors are coupled to said common load network.

11. In a color television receiver for processing a color television signal including a chrominance information component and a color synchronizing burst component having a prescribed phase and frequency, a controlled oscillator comprising:
    an amplifier including a first active device with a first output terminal having a parasitic capacitance associated therewith;
    a source of control signals representative of the frequency and/or phase of said oscillatory signal with respect to said burst component, said source of control signals including a second active device with a second output terminal having a parasitic capacitance associated therewith;
    a common load network coupled to said first and second terminals and comprising amplifying means having a low input impedance relative to an impedance presented by said parasitic capacitances at signal frequencies; and a filter network coupled to said common load network and arranged in a feedback loop of said amplifier for providing regenerative feedback of sufficient magnitude to produce an oscillatory signal at said first terminal, said filter network having a frequency response characteristic centered relatively about said frequency of said burst component for producing said oscillatory signal with a frequency substantially equal to said burst component frequency.

* * * * *